United States Patent [19]

Coppens et al.

[11] Patent Number: 5,508,142
[45] Date of Patent: Apr. 16, 1996

[54] IMAGING ELEMENT AND METHOD FOR MAKING LITHOGRAPHIC PRINTING PLATE ACCORDING TO THE SILVER SALT DIFFUSION TRANSFER PROCESS

[75] Inventors: Paul Coppens, Turnhout; Eric Hoes, Herentals; Ludovicus Vervloet, Kessel, all of Belgium

[73] Assignee: AGFA-GEVAERT, N.V., Mortsel, Belgium

[21] Appl. No.: 267,528

[22] Filed: Jun. 29, 1994

[30] Foreign Application Priority Data

Aug. 5, 1993 [EP] European Pat. Off. ............. 93202310

[51] Int. Cl.⁶ ............................... G03C 8/06; G03C 8/50; G03F 7/07
[52] U.S. Cl. .................. 430/204; 430/227; 430/230; 430/248; 430/259; 430/256; 430/642
[58] Field of Search .................................... 430/204, 230, 430/248, 256, 259, 642, 231, 227

[56] References Cited

U.S. PATENT DOCUMENTS

| | | | |
|---|---|---|---|
| 2,089,460 | 8/1937 | Wilmanns et al. | 430/259 |
| 3,369,901 | 2/1968 | Fogg et al. | 430/227 |
| 4,360,590 | 11/1982 | Tomka | 430/642 |
| 4,606,985 | 8/1986 | Takaya et al. | 430/204 |
| 5,068,165 | 11/1991 | Coppens et al. | 430/204 |
| 5,273,858 | 12/1993 | Coppens et al. | 430/204 |
| 5,340,690 | 8/1994 | Dekeyzer et al. | 430/204 |

*Primary Examiner*—Richard L. Schilling
*Attorney, Agent, or Firm*—Breiner & Breiner

[57] ABSTRACT

The present invention provides an imaging element comprising in the order given (i) a hydrophilic base, (ii) an image receiving layer containing physical development nuclei and (iii) a photosensitive layer containing a silver halide emulsion being in water permeable relationship with said image receiving layer, characterized in that said photosensitive layer or another optional layer being in water permeable relationship therewith contains at least one gelatin species whereof a 10% by weight aqueous solution at 36° C. and pH 6 has a viscosity lower than 20 mPa.s at a shearing rate of 1000 s$^{-1}$.

8 Claims, No Drawings

IMAGING ELEMENT AND METHOD FOR MAKING LITHOGRAPHIC PRINTING PLATE ACCORDING TO THE SILVER SALT DIFFUSION TRANSFER PROCESS

FIELD OF THE INVENTION

The present invention relates to an imaging element for making improved offset printing plates according to the silver salt diffusion transfer process. Furthermore the present invention relates to a method for making improved offset printing plates with said imaging element.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by Andrè Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving layer and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two main types of mono-sheet DTR materials that are distinct because of their different layer arrangement and processing are known. The first type of mono-sheet DTR material comprises on a support, generally paper or a resin support such as polyester, in the order given a silver halide emulsion layer and an image receiving layer containing physical development nuclei as a surface layer. After information-wise exposure and development according to the DTR process a silver image is formed in the surface layer. Since the underlying layers are hydrophilic in nature and the silver image formed on the surface is hydrophobic or can be rendered hydrophobic the thus obtained plate can be used without further processing. These type of printing plates have a low printing endurance typically around 10000 copies.

On the other hand mono-sheet DTR materials are known that comprise a hydrophilic support provided with an image receiving layer containing physical development nuclei and on top thereof a silver halide emulsion layer. After information-wise exposure and development according to the DTR-process a silver image is formed in the image receiving layer. In order to obtain a lithographic printing plate it will then be necessary to remove the now useless silver halide emulsion layer to uncover the silver image formed in the image receiving layer. Said removal is generally carried out by rinsing the element with cold or warm water. This type of printing plate is disclosed e.g. in EP-A-278766, EP-A-483415 and EP-A-410500.

As for other printing plates it is required that the printing plates obtained according to the above described DTR-process have a high printing endurance, good ink acceptance in the printing areas and no ink acceptance in the non-printing areas (no staining). With respect to these requirements it has been experimentally stated that that the complete removal of all of the gelatin of said emulsion layer (or any other gelatin containing layer) from the silver image formed in the image receiving layer is of the uttermost importance. Even by applying intermediate layers, facilitating the removal of said gelatin layer(s) as disclosed in EP-A-483415 and EP-A-410500, there remain spots of gelatin on said silver image formed in the rimage receiving layer especially when the removal of said gelatin layer(s) is made with rinsing water at room temperature, resulting in bad ink acceptance in the printing areas.

SUMMARY OF THE INVENTION

It is an object of the present invention to provide an imaging element for making offset printing plates according to the silver salt diffusion transfer process with improved printing properties.

It is another object of the present invention to provide a method for making offset printing plates with said imaging element having improved printing properties.

Further objects of the present invention will become clear from the description hereinafter.

According to the present invention there is provided an imaging element comprising in the order given (i) a hydrophilic base, (ii) an image receiving layer containing physical development nuclei and (iii) a photosensitive layer containing a silver halide emulsion being in water permeable relationship with said image receiving layer, characterized in that said photosensitive layer and/or another optional layer being in water permeable relationship therewith contains at least one gelatin species whereof a 10% by weight aqueous solution at 36° C. and pH 6 has a viscosity lower than 20 mPa.s at a shearing rate of 1000 s$^{-1}$.

According to the present invention there is also provided a method for making an offset printing plate according to the silver salt diffusion transfer process having improved printing properties comprising the steps of:

(a) image-wise exposing an imaging element comprising in the order given (i) a hydrophilic base, (ii) an image receiving layer containing physical development nuclei and (iii) a photosensitive layer containing a silver halide emulsion being in water permeable relationship with said image receiving layer, (b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse image-wise from the photosensitive layer to said image receiving layer to produce therein a silver image, (c) treating the imaging element to remove the layer(s) on top of said image receiving layer, thereby uncovering said silver image formed in said image receiving layer, characterized in that said photosensitive layer and/or another optional layer being in water permeable relationship therewith contains at least one gelatin species whereof a 10% by weight aqueous solution at 36° C. and pH 6 has a viscosity lower than 20 mPa.s at a shearing rate of 1000 s$^{-1}$.

DETAILED DESCRIPTION OF THE INVENTION

According to the present invention it has been found that a lithographic printing plate prepared according to the DTR-process by using an imaging element, characterized in that the photosensitive layer and/or another optional layer being in water permeable relationship therewith contains a gelatin with a low viscosity has good printing properties, especially good ink acceptance in the printing areas.

As employed herein, viscosity values in mPa.s measured at a shearing rate of 1000 s$^{-1}$ refer to viscosities measured at 36° C. and pH=6 of a 10% by weight aqueous gelatin solutions using a viscosimeter operating with a rotating cylinder and marketed under the tradename HAAKE ROTOVISCO rheometer Type M 10, wherein the cylinder can be rotated at 1000 rpm and a maximal shearing rate of 44,500 s$^{-1}$.

According to the invention the photosensitive layer and/or another optional layer being in water permeable relationship therewith contains at least one gelatin with a viscosity lower than 20 mPa.s. The lower limit is not very important but should preferably be higher than 5 mPa.s. More preferably the viscosity of said gelatin is lower than 15 mPa.s.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

The layer(s) containing at least one gelatin with a viscosity lower than 20 mPa.s can be any layer(s) on top of the image receiving layer being in water permeable relationship with the photosensitive layer. Preferably said gelatin is contained in the photosensitive layer and is preferably added thereto after the physical ripening of the AgX grains.

Although a gelatin layer containing only said low viscosity gelatin could be applied, preferably said gelatin is combined with a gelatin of a higher viscosity. The weight ratio of said low viscosity gelatin versus the gelatin of a higher viscosity is preferably>0.1, more preferably>0.5.

Preferably the gelatin layer(s) is(are) substantially unhardened. Substantially unhardened means that when such gelatin layer is coated on a subbed polyethylene terephtalate film base at a dry thickness of 1.2 g/m$^2$, dried for 3 days at 57° C. and 35% R. H. and dipped in water of 30° C., said gelatin layer is dissolved for >95% by weight within 5 minutes.

The imaging element is preferably prepared by coating the different layers on a hydrophilic base. Alternatively the different layers may be laminated to said image receiving layer from a temporary base holding the layers in reverse order as disclosed in U.S. Pat. No. 5,068,165.

The hydrophilic base can be a hardened hydrophilic layer, containing a hydrophilic synthetic homopolymer or copolymer and being hardened with a hydrolyzed tetraalkyl orthosilicate crosslinking agent coated on a flexible hydrophobic support. More preferably an aluminum support is used as a hydrophilic base.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µm and is sealed with an aqueous bicarbonate solution.

The graining, anodizing, and sealing of the aluminum foil can be performed as described in e.g. in EP-A 567178, U.S. Pat. No. 3,861,917 and in the documents referred to therein.

To promote the image sharpness and, as a consequence thereof, the sharpness of the final printed copy, the anodization layer may be coloured in the mass with an antihalation dye or pigment e.g. as described in JA-Pu-58-14,797.

The image receiving layer for use in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546598. Especially preferred development nuclei in connection with the present invention are palladium sulphide nuclei having an average diameter less than 6 nm and wherein the number of nuclei having a diameter larger than 4.5 nm is less than 15% of the total number of nuclei contained in said image receiving layer.

To promote the image sharpness and, as a consequence thereof, the sharpness of the final printed copy, the hydrophilic base can be provided with a very thin antihalation coating of a dye or pigment, which may be applied before or after said image receiving layer is applied. Also to promote the image sharpness the image receiving layer may incorporate at least one antihalation dye or pigment. The usual dyes and pigments can be chosen such that they prevent or reduce halation in the silver halide emulsions having any desired photosensitivity range comprised between 300 and 900 nm.

The photosensitive layer used in accordance with the present invention may be any silver halide emulsion layer comprising a hydrophilic colloid binder, at least one of the silver halide emulsions being photosensitive.

The photographic silver halide emulsion(s) for coating silver halide emulsion layers in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

According to the present invention the silver halide emulsion or emulsions preferably consist principally of silver chloride while a fraction of silver bromide may be present ranging from 1 mole % to 40 mole %. The silver halide emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. Most preferably a silver halide emulsion containing at least 70 mole % of silver chloride is used.

The average size of the silver halide grains may range from 0.10 to 0.70 μm, preferably from 0.25 to 0.45 μm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The silver halide emulsions can be chemically sensitized. A method of chemical sensitization has been described in the article of R. KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons.

The spectral photosensitivity of the silver halide can also be adjusted for exposure by laser light e.g. helium-neon laser light, argon laser light, and solid state laser light. Dyes that can be used for adjusting the photosensitivity to laser light have been disclosed i.a. in the documents cited in EP-A-93200339.5 and U.S. Pat. No. 5,200,294.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds. Especially good results are obtained with the substituted 1-phenyl 5-mercapto-tetrazole compounds in accordance with the present invention, alone or in combination with other emulsion stabilizers.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers.

The silver halide emulsions may contain pH controlling ingredients. Preferably at least one gelatin containing layer is coated at a pH value not below its iso-electric point to avoid interactions between said gelatin containing coated layer and the hereafter mentioned intermediate layer. More preferably the gelatin layer contiguous to said intermediate layer is coated at a pH value not below its iso-electric point. Most preferably all the gelatin containing layers are coated at a pH value not below their iso-electric point. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P-2,453,217.

More details about the composition, preparation and coating of silver halide emulsions can be found in e.g. Product Licensing Index, Vol. 92, Dec. 1971, publication 9232, p. 107–109.

The imaging element preferably also comprises an intermediate layer between the image receiving layer on the hydrophilic base and the photosensitive layer(packet) to facilate the removal of said layer(packet) thereby uncovering the silver image formed in the image receiving layer by processing the imaging element.

In one embodiment, the intermediate layer can be a water-swellable intermediate layer coated at a ratio of 0.01 to 2.0 g/m2 and comprising at least one non-proteinic hydrophilic film-forming polymer and optionally comprising an antihalation dye or pigment as disclosed in EP-A-410500.

In another embodiment, the intermediate layer can be a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

When the imaging element is prepared by laminating a photosensitive layer or layer packet onto the image receiving layer the intermediate layer(s) are contained in the photosensitive layer packet, the water-swellable intermediate layer or the intermediate layer comprising hydrophobic polymer beads having an average diameter not lower than 0.2 μm and having been prepared by polymerization of at least one ethylenically unsaturated monomer being the upper layer.

A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer are effected with the aid of an aqueous alkaline solution in the presence of (a) developing agent(s) and (a) silver halide solvent(s). The developing agent(s) and/or the silver halide solvent(s) can be incorporated in the aqueous alkaline solution and/or in said silver halide emulsion layer and/or in any of said intermediate layers and/or in a supplemental hydrophilic colloid layer in water-permeable relationship with said silver halide emulsion layer. The latter supplemental hydrophilic colloid layer can be coated on top of said silver halide emulsion layer remotest from said hydrophilic base.

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. More details are disclosed in EP-A-93201649.6. However other developing agents can be used. Preferred amounts of the hydroquinone-type developing agents are in the range of 0.05 mole to 0.25 mole per liter and preferred amounts of secondary developing agent(s) in the range of $1.8 \times 10^{-3}$ to $2.0 \times 10^{-2}$ mole per liter.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are alkanolamines. Alkanolamines that are suitable for use in accordance with the present invention may be of the tertiary, secondary or primary type. Examples of alkanolamines that may be used in connection with the present invention are disclosed in e.g. EP-A 549830.

According to the present invention the alkanolamines are preferably present in the alkaline processing liquid in a concentration preferably between 0.05% and 10% by weight. However part or all of the alkanolamine can be present in one or more layers of the imaging element.

Further suitable silver halide solvents are thioethers. Preferably used thioethers are disclosed in e.g. U.S. Pat. No. 4,960,683 and U.S. Pat. No. 5,200,294.

Still further suitable silver halide solvents are meso-ionic compounds. Preferred meso-ionic compounds for use in accordance with the present invention are triazolium thiolates and more preferably 1,2,4-triazolium-3-thiolates. More details are disclosed in EP-A 554585.

Still further suitable silver halide solvents are sulphite, amines, 2-mercaptobenzoic acid and those disclosed in "The Theory of the Photographic Process" 4th Ed., edited by T. H. James, pages 474–475. Further interesting silver halide solvents have been described in i.a. U.S. Pat. Nos. 2,857, 276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is also possible to incorporate at least one silver halide solvent into a suitable layer of the imaging element and to add at least one other silver halide solvent to the developing solution.

Examples of suitable combinations of different silver halide solvents are a combination of (an) alkanolamine(s) and a thiosulfate as disclosed in EP-A 549831 and 4,6-dihydroxypyrimidines in combination with other silver halide solvents as disclosed in EP-A 549830.

The aqueous alkaline solution may further comprise sulphite e.g. sodium sulphite in an amount ranging from 40 g to 180 g per liter, preferably from 60 to 160 g per liter, and a silver halide solvent, preferably a water soluble thiosulphate and/or thiocyanate in an amount ranging from 5 g to 20 g per liter.

Combinations of at least one silver halide solvent and a regulator may also be used. Suitable regulators are disclosed in EP-A 547660 and in EP-A 576736.

The aqueous alkaline solution used according to the present invention preferably comprises aluminum ions in an amount of at least 0.3 g/l in order to prevent sticking of the emulsion layer to the transporting rollers when the emulsion is swollen with the aqueous alkaline solution. More preferably the aqueous alkaline solution used in accordance with the present invention comprises aluminum ions in an amount of at least 0.6 g/l.

The alkaline processing liquid preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help providing the pH and serve as a silver halide complexing agent.

The processing conditions such as pH, temperature and time may vary within broad ranges provided the mechanical strength of the materials to be processed is not adversely influenced and no decomposition takes place.

The aqueous alkaline solution may further comprise hydrophobizing agents for improving the hydrophobicity of the silver image obtained in the image image receiving layer. Generally these compounds contain a mercapto group or thiolate group and one or more hydrophobic substituents. Examples of hydrophobizing agents are e.g. those described in U.S. Pat. No. 3,776,728, and U.S. Pat. No. 4,563,410. Particularly preferred hydrophobizing agents are long chain (at least 5 carbon atoms) alkyl substituted mercaptotetrazoles. More details are disclosed in EP-A-93201649.6. The hydrophobizing agents can be used alone or in combination with each other.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6 as disclosed in EP-A-519,123.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the lithographic image receiving element an excess of alkaline solution still present on the monosheet layer assemblage may be eliminated, preferably by guiding the monosheet layer assemblage through a pair of squeezing rollers.

The silver image thus obtained in the image receiving layer is subsequently uncovered by treating the imaging element to remove the photosensitive layer and the intermediate layer.

Various embodiments for removing the photosensitive layer and the intermediate layer(s) are disclosed in EP-A 483,415.

According to a particularly preferred embodiment for removing the photosensitive layer(s) and the intermediate layer(s) the imaging element is held under a spray or jet of rinsing water or rinsing aqueous medium. The rinsing aqueous medium used to detach the intermediate layer(s) and the emulsion layer(s)(s) by rinsing may comprise ingredients such as i.a. weak acidifying agents, wetting agents, and hardeners including latent hardeners.

The temperature of the rinsing water may be varied widely but is preferably between 20° C. and 30° C.

The imaged surface of the lithographic base can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic grained and anodized aluminum support. More details are disclosed in EP-A-93201878.1.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid.

The following example illustrates the present invention without however, limiting it thereto. All parts, percentages and ratios are by weight unless otherwise indicated.

EXAMPLE 1

Preparation of the silver halide emulsion coating solution 1 to 7.

A silver chlorobromide emulsion composed of 98.2 mole % of chloride and 1.8 mole % of bromide was prepared by the double jet precipitation method in an aqueous solution containing 35 g/mole $AgNO_3$ of gelatin A with a viscosity of 21 mPa.s. After precipitation and desalting by washing with demineralized water, the silver halide grains were redispersed by adding one or more of the gelatins A, B (viscosity of 11 mPa.s) or C (viscosity of 40 mPa.s) and water to obtain the required concentration on AgX. The average silver halide grain size was 0.4 μm (diameter of a sphere with equivalent volume) and contained Rhodium ions as internal dopant. The emulsions were blue sensitized and stabilized by 1-phenyl-5-mercapto-tetrazole.

The type and amount of gelatin in the various coating compositions, all containing AgX in an amount corresponding to 100 g $AgNO_3$ are given in Table 1.

TABLE 1

| Solution | gel A (g/l) (21 mPa.s) | gel B (g/l) (11 mPa.s) | gel C (g/l) (40 mPa.s) |
|---|---|---|---|
| 1 | 20 | 0 | 45 |
| 2 | 35 | 0 | 30 |
| 3 | 20 | 15 | 30 |
| 4 | 20 | 45 | 0 |
| 5 | 20 | 0 | 80 |
| 6 | 70 | 0 | 30 |
| 7 | 20 | 50 | 30 |
| 8 | 20 | 80 | 0 |

Preparation of the imaging elements I to VII

An imaging element I was obtained by coating a grained, anodized and sealed aluminum support with a silver-receptive stratum containing 0.7 mg/m² PdS as physical development nuclei.

An intermediate layer was then provided on the dry silver-receptive stratum from an aqueous composition in such a way that the resulting dried layer had a weight of 0.5 g of polymethyl methacrylate beads per m², said composition comprising:

| | |
|---|---|
| a 20% dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water | 300 ml |

(pH-value: 5.6)

Finally the silver halide emulsion coating solution 1 was coated on the intermediate layer, the silver halide being provided in an amount corresponding to 2.40 g of silver nitrate per m² and the gelatin content of the emulsion layer being 1.58 g/m².

The imaging elements II to VIII were prepared in an identical way except that coating solution 1 was substituted respectively by coating solutions 2 to 8, the silver halide in the imaging elements V to VIII being provided in an amount corresponding to 1.58 g of silver nitrate per m².

The 8 imaging elements were identically exposed through a contact screen in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene dismine tetraacetic acid tetrasodium salt | 2 g |
| demineralized water to make | 1000 ml | pH (24° C.) = 13

The initiated diffusion transfer was allowed to continue for 30 s to form a silver image in the image receiving layers.

To remove the developed silver halide emulsion layer and the intermediate layer from the aluminum foils the developed monosheet DTR materials were rinsed for 30 s with a water jet at 20° C.

Next, the imaged surface of the aluminum foil was rubbed with a fixer to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml | pH (20° C.) = 4

The printing plates thus prepared were mounted on the same offset printing machine (Heidelberg GTO-46) and were printed under identical conditions. A commercial dampening solution AQUA TAME (tradename) was used at a 5% concentration for fountain solution, and K+E 125 as ink. A compressible rubber blanket was used.

The results are given in the following Table 2.

The ease of gelatin removal and the ink acceptance were evaluated as follows:

a) ease of gelatin removal: the number relates to a visual evaluation on a relative scale from 0 to 5, where 0 stands for a complete removal and 5 for no removal of the intermediate layer and the emulsion layer from the image receiving layer:

b) ink acceptance: the first number indicates the number of copies that has to be printed before a constant print quality with regard to the ink accepting areas is obtained; the second number relates to the presence of white spots in the ink accepting areas of the 25th copy and is visually evaluated on a relative scale from 0 to 5, where 0 stands for a total absence of white spots in the printing areas where 5 indicates a very high number of white spots in the printing areas.

TABLE 2

| Sample | Gelatin removal | Ink acceptance |
|---|---|---|
| 1 | 1–2 | 25/1 |
| 2 | 1–2 | 25/0–1 |
| 3 | 1 | 15/0–1 |
| 4 | 0 | 10/0–1 |
| 5 | 2 | >25/2 |
| 6 | 2 | >25/1–2 |
| 7 | 0–1 | 15/0–1 |
| 8 | 0 | 10/0–1 |

Evaluation:

From the above it can be seen that when a DTR imaging element is used comprising a gelatin layer containing a gelatin with a viscositry according to the invention, the uncovering of the image receiving layer by using rinsing water at room temperature is effectively performed and printing plates with a good ink acceptance are obtained.

We claim:

1. An imaging element comprising in the order given (i) a hydrophilic base, (ii) an image receiving layer containing physical development nuclei, (iii) an intermediate layer comprising a non-proteinic hydrophilic film-forming polymer or hydrophobic polymer beads having an average diameter not lower than 0.2 µm and having been prepared by polymerization of a ethylenically unsaturated monomer and (iv) a photosensitive layer containing a silver halide emulsion being in water permeable relationship with said image receiving layer, characterized in that said photosensitive layer and/or another optional layer being in water permeable relationship therewith contains at least one gelatin species whereof a 10% by weight aqueous solution at 36° C. and pH 6 has a viscosity lower than 20 mPa.s at a shearing rate of $1000\ s^{-1}$ and that at least one gelatin containing layers is coated at a pH value not below its iso-electric point.

2. An imaging element according to claim 1 wherein said gelatin has a viscosity lower than 15 mPa.s.

3. An imaging element according to claim 1 or 2, wherein said gelatin is contained in the photosensitive layer.

4. An imaging element according to any of claims 1 to 3, wherein said gelatin is combined in the same layer with a gelatin whereof a 10% by weight aqueous solution at 36° C. and pH 6 has a viscosity of at least 20 mPa.s at a shearing rate of $1000\ s^{-1}$ the weight ratio in said layer of said gelatin of a lower viscosity versus said gelatin of a higher viscosity being>0.1.

5. An imaging element according to claim 4, wherein the weight ratio in said layer of said gelatin of a lower viscosity versus said gelatin of a higher viscosity is>0.5.

6. An imaging element according to any of claims 1 to 5, wherein the gelatin layer(s) is(are) substantially unhardened.

7. A method for making an improved offset printing plate according to the silver salt diffusion transfer process comprising the steps of:

(a) image-wise exposing an imaging element according to any of claim 1, (b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse image-wise from the photosensitive layer to said image receiving layer to produce therein a silver image, (c) treating the imaging element to remove the layer(s) on top of said image receiving layer, thereby uncovering said silver image formed in said image receiving layer.

8. A method according to claim 7 wherein said imaged surface obtained after removing the photosensitive layer and the intermediate layer, is treated with a fixer to enhance the water-receptivity of the non-image areas and to enhance the ink-receptivity of the image areas.

* * * * *